United States Patent
Dilliway et al.

(10) Patent No.: US 10,109,492 B2
(45) Date of Patent: Oct. 23, 2018

(54) METHOD OF FORMING A HIGH QUALITY INTERFACIAL LAYER FOR A SEMICONDUCTOR DEVICE BY PERFORMING A LOW TEMPERATURE ALD PROCESS

(71) Applicant: GLOBALFOUNDRIES Inc., Grand Cayman (KY)

(72) Inventors: Gabriela Dilliway, Dresden (DE); Dina Triyoso, Dresden (DE); Elke Erben, Dresden (DE); Rimoon Agaiby, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1137 days.

(21) Appl. No.: 13/775,416

(22) Filed: Feb. 25, 2013

(65) Prior Publication Data

US 2014/0242788 A1  Aug. 28, 2014

(51) Int. Cl.
*H01L 21/28* (2006.01)
*H01L 21/8238* (2006.01)
*H01L 21/02* (2006.01)
*H01L 29/66* (2006.01)

(52) U.S. Cl.
CPC .... *H01L 21/28255* (2013.01); *H01L 21/0228* (2013.01); *H01L 21/02164* (2013.01); *H01L 21/823807* (2013.01); *H01L 21/823821* (2013.01); *H01L 29/66651* (2013.01)

(58) Field of Classification Search
CPC ........... H01L 21/28255; H01L 21/0228; H01L 21/02164; H01L 21/823821; H01L 21/823807; H01L 29/66651; H01L 21/28264; H01L 29/78681; H01L 29/78684; H01L 29/7869; H01L 21/0229; H01L 21/3141

See application file for complete search history.

(56) References Cited

U.S. PATENT DOCUMENTS

| | | | |
|---|---|---|---|
| 6,222,234 B1* | 4/2001 | Imai | H01L 27/1203 257/347 |
| 2003/0161951 A1* | 8/2003 | Yuan | C23C 16/402 427/255.28 |
| 2004/0018694 A1* | 1/2004 | Lee | C23C 16/402 438/400 |
| 2007/0117350 A1* | 5/2007 | Seacrist et al. | 438/459 |
| 2008/0096349 A1* | 4/2008 | Park | H01L 21/02178 438/257 |
| 2010/0197128 A1* | 8/2010 | Schaeffer et al. | 438/591 |

(Continued)

OTHER PUBLICATIONS

Anthony C. Jones, Chemical Vapour Deposition: Precursors, Processes and Applications, Dec. 22, 2008, Chapter 4, Atomic Layer Deposition 4.2.1 Principles and Characteristic Features of ALD, pp. 158-160.*

*Primary Examiner* — Julio J Maldonado
*Assistant Examiner* — Stanetta Isaac
(74) *Attorney, Agent, or Firm* — Amerson Law Firm, PLLC (57) ABSTRACT

One illustrative method disclosed herein includes performing an atomic layer deposition (ALD) process at a temperature of less than 400° C. to deposit a layer of silicon dioxide on a germanium-containing region of semiconductor material and forming a gate structure of a transistor device above the layer of silicon dioxide.

20 Claims, 3 Drawing Sheets

(56) References Cited

U.S. PATENT DOCUMENTS

2011/0108943 A1* 5/2011 Dennard et al. .............. 257/506
2014/0239418 A1* 8/2014 Wang ................ H01L 21/02304
　　　　　　　　　　　　　　　　　　　　　　　257/411

* cited by examiner

METHOD OF FORMING A HIGH QUALITY INTERFACIAL LAYER FOR A SEMICONDUCTOR DEVICE BY PERFORMING A LOW TEMPERATURE ALD PROCESS

BACKGROUND OF THE INVENTION

1. Field of the Invention

Generally, the present disclosure relates to the manufacture of sophisticated semiconductor devices, and, more specifically, to various methods of forming a high quality interfacial layer on semiconductor devices by performing a low temperature atomic layer deposition (ALD) process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Metal oxide field effect transistors (MOSFETs or FETs) represent one important type of circuit element that substantially determines performance of the integrated circuits. A FET (whether an NFET or a PFET) is a device that typically includes a source region, a drain region, a channel region that separates the source region and the drain region, and a gate electrode positioned above the channel region. A gate insulation layer is positioned between the gate electrode and the channel region. Electrical contacts are made to the source and drain regions, and current flow through the FET is controlled by controlling the voltage applied to the gate electrode. For example, for an NFET device, if there is a zero voltage applied to the gate electrode, then there is no current flow through the device (ignoring undesirable leakage currents, which are relatively small). However, when a voltage above the threshold voltage of the device is applied to the gate electrode, the channel region becomes conductive, and electrical current is permitted to flow between the source region and the drain region through the conductive channel region. Traditionally, FETs have been substantially planar devices, but similar principles of operation apply to more three-dimensional FET structures, devices that are typically referred to as FinFETs.

For many early device technology generations, the gate structures of most transistor elements have been comprised of silicon-based materials, such as a silicon dioxide and/or silicon oxynitride gate insulation layer, in combination with a polysilicon gate electrode, i.e., so-called SiON/Poly-Si-Gate technology devices. Historically, the channel length of SiON/Poly-Si-Gate transistor devices was reduced to increase the electrical performance characteristics of the transistors, e.g., to improve the drive current capability of the device and to increase its switching speed. However, with these traditional SiON/Poly-Si-Gate transistor devices, the reduction in channel length reached a limit where undesirable so-called short channel effects caused a decrease in device performance, e.g., an increase in off-state leakage currents. Thus, many newer generation devices employ gate structures comprised of alternative materials in an effort to avoid such short channel effects that were associated with the use of SiON/Poly-Si-Gate transistor devices with very small channel lengths. For example, in some aggressively scaled transistor elements, which may have channel lengths on the order of approximately 14-32 nm, gate structures having a so-called high-k dielectric/metal gate (HK/MG) configuration have been shown to provide significantly enhanced operational characteristics over the traditional SiON/Poly-Si-Gate transistor devices.

Depending on the specific overall device requirements, several different high-k materials—i.e., materials having a dielectric constant, or k-value, of approximately 10 or greater—have been used with varying degrees of success for the gate insulation layer in HK/MG gate structures. For example, in some transistor element designs, a high-k gate insulation layer, which may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like, was formed by depositing the high-k material on the substrate. Thereafter, one or more non-polysilicon metal gate electrode materials—i.e., a metal gate stack—was used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like. Silicon-based gate electrode materials could not be used with such high-k gate insulation layers because the resulting transistors exhibited a threshold voltage level that was too high, primarily due to a degradation in the charge carrying capability of the channel.

Additionally, in many cases, modern integrated circuit products contain different regions where the various transistor devices have interfacial insulation layers with different thicknesses. The fact that the products have these different regions with different layer thicknesses can add to processing complexity. FIGS. 1A-1D depict one illustrative prior art process flow that will be referenced for purposes of disclosing at least some of the problems associated with manufacturing such a prior art product.

Figure 1A:
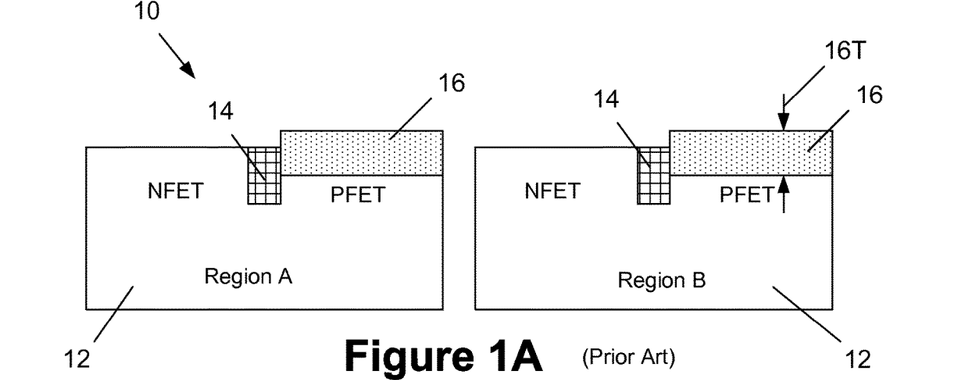
FIGS. 1A-1D depict an illustrative prior art method for forming interfacial layers on an integrated circuit product.

As shown in FIG. 1A, the product 10 is formed above a semiconducting substrate 12 wherein illustrative isolation regions 14 have been formed in the substrate 12 to define active regions where a plurality of NFET and PFET devices will be formed. In this example, the substrate has Regions A and B, where the transistor devices in Region A of the substrate 12 will have a thicker interfacial layer than the transistor device in Region B. At the point of fabrication depicted in FIG. 1A, illustrative silicon/germanium regions 16 have been formed in the substrate 12 using traditional techniques. In general, the silicon/germanium regions 16 are formed for the PFET devices because it enhances the mobility of charge carriers in the PFET devices, i.e., holes. The silicon/germanium regions 16 are formed using techniques well known to those skilled in the art.

Figure 1B:
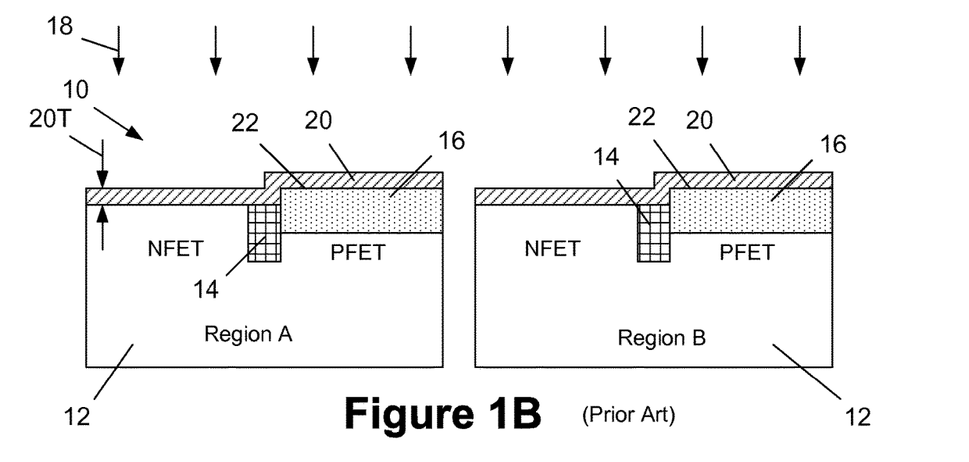

FIG. 1B depicts the product 10 after various process operations, schematically depicted by the arrows 18, are performed to initially form and thereafter treat an illustrative silicon dioxide interfacial layer 20 across the entire substrate 12, including Regions A and B. The first part of the processes represented by the arrows 18 involves performing a chemical vapor deposition (CVD) process at a relatively high temperature, e.g., 600-800° C., to initially form the silicon dioxide interfacial layer 20. The silicon dioxide interfacial layer 20 is typically formed to a thickness 20T which corresponds to the desired thickness of the final interfacial layer in Region A, i.e., the region with devices requiring the thicker interfacial layer. For example, in one illustrative embodiment, the thickness 20T may fall within the range of about 3-4 nm. Unfortunately, performing this high temperature CVD process to form the silicon dioxide interfacial layer 20 causes some out-diffusion of germanium in the silicon/germanium regions 16 of the PFET devices.

This out-diffusion of germanium results in the formation of germanium oxide (not shown) at the interface 22 between the silicon dioxide interfacial layer 20 and the silicon/germanium region 16. Unfortunately, germanium oxide is relatively unstable and is not a desirable material for an interfacial layer on a modern integrated circuit product because of the high density of defects that act as charge traps, which degrades the reliability of the PFET devices.

In an effort to eliminate some of the defects in the silicon dioxide interfacial layer 20, the second part of the process operations 18 involves performing a decoupled plasma oxidation process to densify the silicon dioxide interfacial layer 20. In one illustrative embodiment, this plasma oxidation process may be performed at a temperature of about 100-800° C. for a duration of about 5-300 seconds. After the plasma oxidation process is completed, the final part of the schematically depicted process operations 18 involves performing a rapid thermal anneal process on the product 10. In one illustrative embodiment, the rapid thermal anneal process may be performed at a temperature of about 500-1100° C. for a duration of about 5-300 seconds.

Figure 1C:
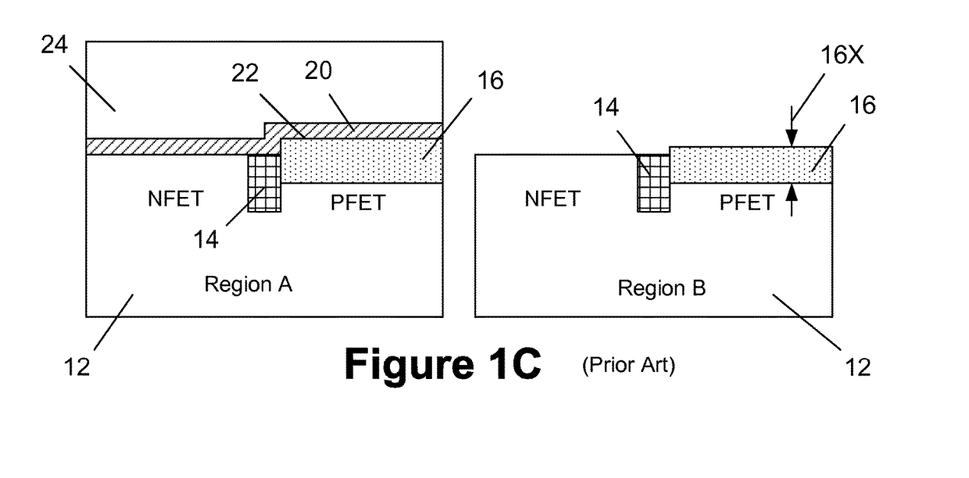

FIG. 1C depicts the product 10 after several process operations were performed. First, a patterned mask layer 24 was formed that masks Region A while leaving Region B exposed for further processing. Thereafter, the portion of the silicon dioxide interfacial layer 20 above the Region B was removed by performing an etching or stripping process, typically a wet etching process. Unfortunately, the surface of the silicon/germanium layer 16 for the PFET device in Region B has an undesirable roughness, which can lead to problems such as undesirable and unpredictable shifts in the threshold voltage of the affected PFET device and higher within-wafer variations in the threshold voltages of the devices formed on the substrate 12. The removal of the silicon dioxide interfacial layer 20 also causes excessive loss of the underlying silicon/germanium region 16. That is, as depicted, the thickness 16X of the silicon/germanium region 16 is less than the original thickness 16T of the silicon/germanium material 16.

Figure 1D:
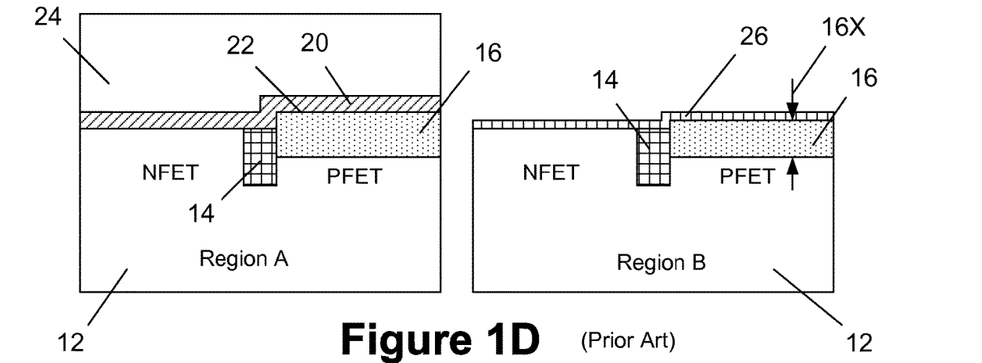

FIG. 1D depicts the product 10 after several process operation have been performed. First, the silicon dioxide interfacial layer 20 was removed from above the exposed Region B to thereby expose the silicon/germanium region 16. Thereafter, a second silicon dioxide interfacial layer 26 was formed above the devices in Region B. In one illustrative embodiment, the second silicon dioxide interfacial layer 26 was formed by performing a chemical based deposition process and it may have a thickness of about 1 nm. Thereafter, a nitridation process is performed on the second silicon dioxide interfacial layer 26 whereby nitrogen is incorporated into the second silicon dioxide interfacial layer 26. After the nitridation process is performed, a RTO (rapid thermal oxidation) process is performed to grow a layer of silicon dioxide that is about 2-4 nm thick. At the point of fabrication depicted in FIG. 1D, the patterned mask layer 24 is removed and traditional manufacturing operations are performed to fabricate semiconductor devices, e.g., FinFET devices and/or planar transistor devices, above the Regions A and B.

The present disclosure is directed to various methods of forming a high quality interfacial layer on semiconductor devices by performing a low temperature atomic layer deposition (ALD) process that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a high quality interfacial layer on semiconductor devices by performing a low temperature atomic layer deposition (ALD) process. One illustrative method disclosed herein includes performing an atomic layer deposition (ALD) process at a temperature of less than 400° C. to deposit a layer of silicon dioxide on a germanium-containing region of semiconductor material and forming a gate structure of a transistor device above the layer of silicon dioxide. In more detailed embodiments, the layer of silicon dioxide may have an interface trap density ($D_{it}$) value that is less than $1e^{12}$ $cm^{-2}eV^{-1}$ and/or a surface roughness having a root mean square (RMS) value that is less than or equal to 0.1 nm.

Another illustrative method disclosed herein includes performing an atomic layer deposition (ALD) process at a temperature of less than 400° C. to deposit a layer of silicon dioxide having an original thickness on first and second spaced-apart germanium-containing regions of semiconductor material, forming a masking layer above the layer of silicon dioxide, wherein the masking layer covers a first portion of the layer of silicon dioxide positioned above the first germanium-containing region and exposes a second portion of the layer of silicon dioxide positioned above the second germanium-containing region, and performing an etching process to reduce a thickness of the exposed second portion of the layer of silicon dioxide to thereby define a reduced thickness layer of silicon dioxide having a post-etch thickness that is less than the original thickness. In this illustrative embodiment, the method further comprises the steps of removing the masking layer, forming a first gate structure of a first transistor device above the layer of silicon dioxide having said original thickness and forming a second gate structure of a second transistor device above the reduced thickness layer of silicon dioxide having the post-etch thickness. In more detailed embodiments, the layer of silicon dioxide may have an interface trap density ($D_{it}$) value that is less than $1e^{12}$ $cm^{-2}eV^{-1}$ and/or a surface roughness having a root mean square (RMS) value that is less than or equal to 0.1 nm.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a high quality interfacial layer on semiconductor devices by performing a low temperature atomic layer deposition (ALD) process. As will be readily apparent to those skilled in the art upon a complete reading of the present application, the presently disclosed methods and devices may be applied to a variety of different technologies, e.g., NFET, PFET, CMOS, etc., and they may be readily employed with a variety of integrated circuit devices, including, but not limited to, logic devices, memory devices, etc. With reference to the attached figures, various illustrative embodiments of the methods and devices disclosed herein will now be described in more detail.

Figure 2A:
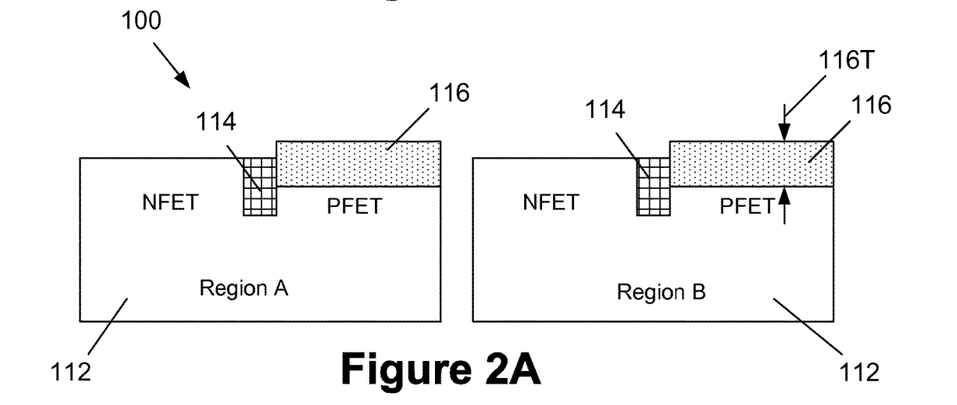
FIGS. 2A-2D depict one illustrative process flow disclosed herein for forming a high quality interfacial layer on a semiconductor device.

As shown in FIG. 2A, an illustrative integrated circuit product 100 is formed above a semiconducting substrate 112 wherein illustrative isolation regions 114 have been formed in the substrate 112 to define active regions where a plurality of NFET and PFET devices will be formed. In this example, the substrate has Regions A and B, where the transistor devices in Region A of the substrate 112 will have a thicker interfacial layer than the transistor devices in Region B. As will be recognized by those skilled in the art after a complete reading of the present application, any type of semiconductor device, e.g., a FinFET device, a planar FET device, etc., may be formed above the various active regions defined in the substrate 112. The substrate 112 may have a variety of configurations, such as the depicted bulk silicon configuration. The substrate 112 may also have a silicon-on-insulator (SOI) configuration that includes a bulk silicon layer, a buried insulation layer and an active layer, wherein semiconductor devices are formed in and above the active layer. Thus, the terms "substrate," "semiconductor substrate" or "semiconducting substrate" should be understood to cover all forms of semiconductor structures and all semiconductor materials.

With continuing reference to FIG. 2A, a plurality of spaced-apart germanium-containing regions of semiconductor material 116 have been formed in the substrate 112. In one illustrative embodiment, the germanium-containing regions of semiconductor material 116 may be comprised of silicon/germanium, germanium or any other semiconductor material that provides for increased charge carrier mobility, i.e., increased hole or electron mobility, as compared to traditional silicon. In general, the germanium-containing regions of semiconductor material 116 are formed for the PFET devices because it enhances the mobility of charge carriers in the PFET devices, i.e., holes. The germanium-containing regions of semiconductor material 116 may have any desired original thickness 116T and they may be formed using techniques well known to those skilled in the art.

Figure 2B:
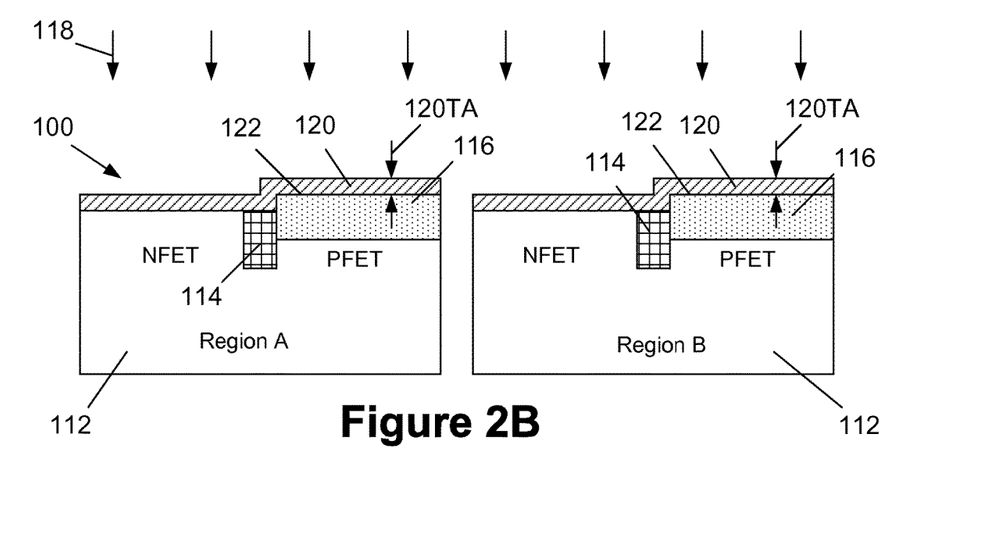

FIG. 2B depicts the product 100 after a low temperature atomic layer deposition (ALD) process 118 has been performed to form an illustrative silicon dioxide interfacial layer 120 across the entire substrate 112 and on the spaced-apart germanium-containing regions of semiconductor material 116 formed in the Regions A and B. In one illustrative embodiment, the ALD process 118 is performed at a temperature that is less than about 400° C. The initial thickness 120TA of the silicon dioxide interfacial layer 120 may vary depending upon the particular application. In one example, based upon current-day technologies. the initial thickness 120TA may fall within the range of about 3-5 nm. Importantly, the thickness 120TA corresponds to the desired thickness of the thicker of the interfacial layers to be ultimately formed on the product 100. In one illustrative embodiment, the low temperature ALD process 118 may be performed using complex organometallic precursors, such as SAM24, TDMAS (amino silanes) and $SiCl_4$, although other precursors may be used if desired or needed for the particular application. The flow rates of such precursors may also vary. In one illustrative embodiment, the flow rate of the precursors was about 50-2000 sccm. As a result of using the low temperature ALD process 118 to initially form the silicon dioxide interfacial layer 120, out-diffusion of germanium from the germanium-containing regions of semiconductor material 116 is substantially prevented, which substantially eliminates the formation of undesirable germanium oxide at the interface 122 between the silicon dioxide interfacial layer 120 and the germanium-containing regions of semiconductor material 116. In one particular embodiment, the above-described process prevents the formation of any germanium oxide at the interface 122 between the silicon dioxide interfacial layer 120 and the germanium-containing regions of semiconductor material 116.

The low temperature ALD process 118 also results in the silicon dioxide interfacial layer 120 being a higher quality layer of silicon dioxide as compared to the lower quality silicon dioxide layer 20 formed using the prior art high temperature CVD process, as described in the background section of the application. That is, the silicon dioxide interfacial layer 120 deposited by ALD is a highly conformal layer, thus securing a good coverage of any interfacial defects and preventing them from acting as charge traps and degrading the device performance and reliability. The highly conformal nature of the silicon dioxide interfacial layer 120 also allows depositing the silicon dioxide interfacial layer 120 in complex structures. The silicon dioxide interfacial layer 120 as thus deposited has a lower density of point/extended defects. Additionally, by forming the silicon dioxide interfacial layer 120 by performing the low temperature ALD process 118, the prior art decoupled plasma oxidation process and rapid thermal anneal process that was performed on the prior art silicon dioxide interfacial layer 20 may be omitted during the manufacture of some devices. Omitting the prior art decoupled plasma oxidation process and rapid thermal anneal process prevents or reduces the undesirable loss of any underlying semiconductor material 116, e.g., silicon/germanium, on which the silicon dioxide interfacial layer 120 disclosed herein is deposited. The silicon dioxide interfacial layer 120 as disclosed herein also acts to limit or prevent any out-diffusion of any species in the underlying semiconductor material 116, e.g., germanium in the embodiment disclosed herein, that can adversely affect the interface between the silicon dioxide interfacial layer 120 as disclosed herein and the underlying semiconductor material 116. This process described herein for forming the silicon dioxide interfacial layer 120 also simplifies the integration scheme, resulting in cost reduction.

As noted above, as compared to prior art silicon dioxide interfacial layers made using prior art processes, such as the processes described in the background section of this application, the novel silicon dioxide interfacial layer 120 disclosed herein that is formed by the above-described low temperature ALD process is a higher quality layer of silicon dioxide. For example, the silicon dioxide interfacial layer 120 is highly conformal and controllable (by virtue of the low temperature ALD process, i.e., atomic monolayer-by-monolayer deposition). Additionally, the novel silicon dioxide interfacial layer 120 disclosed herein exhibits much less variation in thickness, i.e., a greater thickness uniformity, as compared to the prior art silicon dioxide interfacial layer, which is a desired characteristic when forming modern semiconductor devices. As a more specific example, in one illustrative embodiment, the standard deviation (STD) of the thickness of the silicon dioxide interfacial layer 120 disclosed herein is decreased by at least a factor of 2 (from >1 to ~0.5,) as compared to prior art interfacial silicon dioxide layers. The novel silicon dioxide interfacial layer 120 disclosed herein also exhibits less surface roughness than prior art interfacial silicon dioxide layers, which is another indication of the higher quality of the silicon dioxide interfacial layer 120. For example, the RMS (root mean square) of the surface roughness of the silicon dioxide interfacial layer 120 disclosed herein may be about 0.1 nm or less, a surface roughness value that is less than a typical prior art interfacial silicon dioxide (thermal oxide) layer. In other cases, the surface roughness of the silicon dioxide interfacial layer 120 may be greater than the values mentioned above. Yet another indication of the higher quality of the silicon dioxide interfacial layer 120 disclosed herein is reflected in the relative values of the interface trap density ($D_{it}$). For the novel silicon dioxide interfacial layer 120 disclosed herein, the interface trap density ($D_{it}$) may be at least 50% lower than the interface trap density ($D_{it}$) for typical prior art interfacial silicon dioxide layers, which has a typical value of $1e^{12}$ cm$^{-2}$eV$^{-1}$ or greater. In some cases, the interface trap density ($D_{it}$) for the silicon dioxide interfacial layer 120 disclosed herein may be about two orders of magnitude lower than the interface trap density ($D_{it}$) for typical prior art interfacial silicon dioxide layers.

Figure 2C:
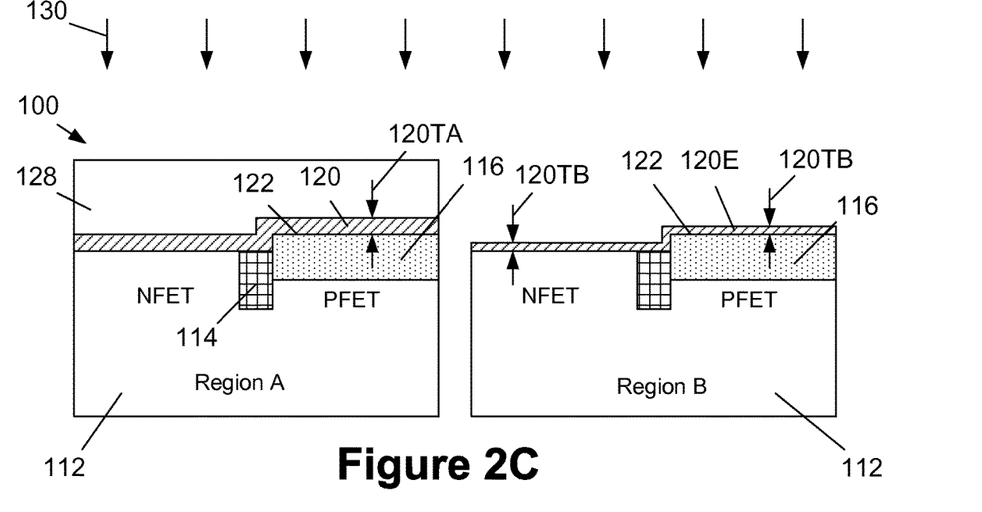

FIG. 2C depicts the product 100 after several process operations were performed. First, a patterned mask layer 128 was formed that masks Region A while leaving Region B exposed for further processing. Thereafter, an etching process 130 was performed to reduce the thickness of the portion of the silicon dioxide interfacial layer 120 positioned above the Region B and thereby define an etched silicon dioxide interfacial layer 120E. After the etching process 130 is completed, the etched silicon dioxide interfacial layer 120E has a post etch thickness 120TB that is less than the original thickness 120A of the silicon dioxide interfacial layer 120. The post etch thickness 120TA may vary depending upon the particular application but, in one illustrative embodiment, the post etch thickness 120TB may be about 1 nm. Since the Region A was masked during the etching process 130, the silicon dioxide interfacial layer 120 has its original thickness 120TA above the Region A. Note that by reducing the thickness of the silicon dioxide interfacial layer 120 above the Region B, as opposed to completely removing the silicon dioxide interfacial layer 20 in the prior art process flow, there is no consumption of the germanium-containing region of semiconducting material 116 using the novel process flow described herein, and no undesirable roughening of the surface of the germanium-containing region of semiconducting material 116 as occurred with the prior art process flow.

Figure 2D:
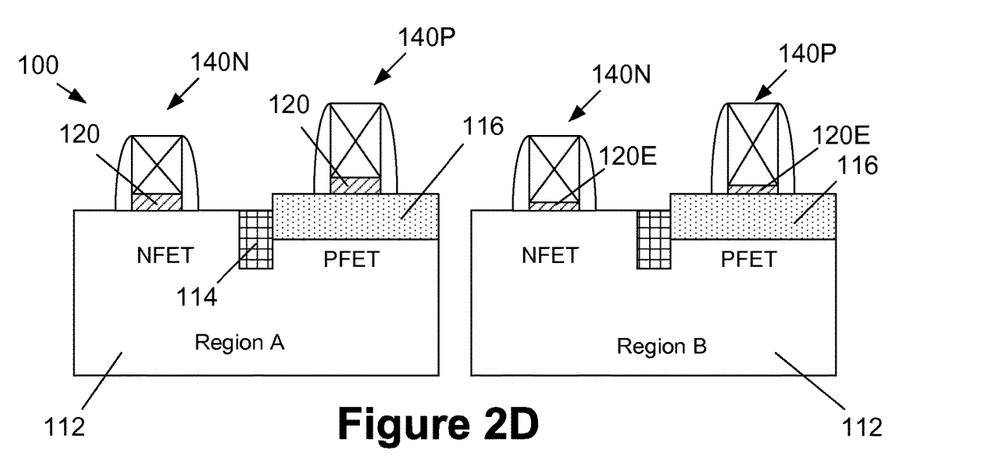

At the point of fabrication depicted in FIG. 2C, the patterned mask layer 128 may be removed and traditional manufacturing operations may be performed to fabricate semiconductor devices, e.g., FinFET devices and/or planar transistor devices above the Regions A and B. To that end, FIG. 2D depicts the product 100 at the point in fabrication wherein illustrative and schematically depicted gate structures 140N, 140P for the NFET and PFET devices, respectively, have been formed above the substrate 112. Note that the devices in Region B have the thinner etched silicon dioxide interfacial layer 120E while the devices in Region B have the thicker silicon dioxide interfacial layer 120. The gate structures 140N, 140P may be formed using so-called "gate-first" or "replacement-gate" ("gate-last") techniques. The gate structures 140N, 140P may also include an illustrative gate cap layer (not shown). The gate insulation layer(s) (not shown) of the gate structures 140N, 140P may be comprised of a variety of different materials, such as, for example, a so-called high-k (k greater than 7) insulation material (where k is the relative dielectric constant), etc. The thickness of the gate insulation layer(s) may also vary depending upon the particular application, e.g., it may have a thickness of about 1-2 nm. Similarly, the gate electrodes of the gate structures 140N, 140P may also be comprised of a variety of conductive materials, such as one or more metal layers that act as the gate electrode. Of course, the materials of construction for the gate structures 140N, 140P may likely be different. As will be recognized by those skilled in the art after a complete reading of the present application, the gate structures 140N, 140P depicted in the drawings are intended to be representative in nature. That is, the gate structures 140N, 140P may be comprised of a variety of different materials and may have a variety of configurations. At the point of fabrication depicted in FIG. 2D, traditional manufacturing techniques may be performed to complete the manufacture of the device 100. For example, various contacts and metallization layers may be formed above the device using traditional techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
   performing an atomic layer deposition (ALD) process at a temperature of less than 400° C. to deposit a layer of silicon dioxide on a germanium-containing region of semiconductor material, wherein a root mean square (RMS) of a surface roughness of an upper surface of said layer of silicon dioxide as deposited is less than or equal to 0.1 nm; and
   forming a gate structure of said transistor device above said layer of silicon dioxide.

2. The method of claim 1, wherein said germanium-containing region of semiconductor material is one of silicon/germanium or germanium.

3. The method of claim 1, wherein said transistor device is one of a planar FET device or a FinFET device.

4. The method of claim 1, wherein said germanium-containing region of semiconductor material is positioned in a silicon substrate.

5. The method of claim 1, wherein said layer of silicon dioxide has an interface trap density ($D_{it}$) value as deposited that is less than $1e^{12}$ $cm^{-2}$ $eV^{-1}$.

6. The method of claim 1, wherein said ALD process is performed using an organometallic precursor.

7. A method of forming a transistor, comprising:
   performing an atomic layer deposition (ALD) process at a temperature of less than 400° C. to deposit a layer of silicon dioxide on a region of silicon/germanium, wherein said layer of silicon dioxide has an interface trap density ($D_{it}$) value as deposited that is less than $1e^{12}$ $cm^{-2}$ $eV^{-1}$; and
   forming a gate structure of said transistor device above said layer of silicon dioxide.

8. The method of claim 7, wherein a root mean square (RMS) of a surface roughness of an upper surface of said layer of silicon dioxide as deposited is less than or equal to 0.1 nm.

9. The method of claim 7, wherein said ALD process is performed using an organometallic precursor.

10. A method, comprising:
    performing an atomic layer deposition (ALD) process at a temperature of less than 400° C. to deposit a layer of silicon dioxide having an original thickness on first and second spaced-apart germanium-containing regions of semiconductor material, wherein a root mean square (RMS) of a surface roughness of an upper surface of said layer of silicon dioxide as deposited is less than or equal to 0.1 nm;
    forming a masking layer above said layer of silicon dioxide, wherein said masking layer covers a first portion of said layer of silicon dioxide positioned above said first germanium-containing region and exposes a second portion of said layer of silicon dioxide positioned above said second germanium-containing region;
    performing an etching process to reduce a thickness of said exposed second portion of said layer of silicon dioxide to thereby define a reduced thickness layer of silicon dioxide having a post-etch thickness that is less than said original thickness;
    removing said masking layer;
    forming a first gate structure of a first transistor device above said layer of silicon dioxide having said original thickness; and
    forming a second gate structure of a second transistor device above said reduced thickness layer of silicon dioxide having said post-etch thickness.

11. The method of claim 10, wherein each of said first and second spaced-apart germanium-containing regions of semiconductor material is one of silicon/germanium or germanium.

12. The method of claim 10, wherein said original thickness falls within the range of 3-5 nm and said post-etch thickness is about 1 nm.

13. The method of claim 10, wherein said first transistor device is one of a planar FET device or a FinFET device and said second transistor device is one of a planar FET device or a FinFET device.

14. The method of claim 10, wherein each of said first and second spaced-apart germanium-containing regions of semiconductor material is positioned in a silicon substrate.

15. The method of claim 10, wherein said layer of silicon dioxide has an interface trap density ($D_{it}$) value as deposited that is less than $1e^{12}$ $cm^{-2}$ $eV^{-1}$.

16. The method of claim 10, wherein said ALD process is performed using an organometallic precursor.

17. A method, comprising:
    performing an atomic layer deposition (ALD) process at a temperature of less than 400° C. to deposit a layer of silicon dioxide having an original thickness on first and second spaced-apart regions of silicon/germanium, wherein said layer of silicon dioxide has an interface trap density ($D_{it}$) value as deposited that is less than $1e^{12}$ $cm^{-2}$ $eV^{-1}$;
    forming a masking layer above said layer of silicon dioxide, wherein said masking layer covers a first portion of said layer of silicon dioxide positioned above said first silicon/germanium region and exposes a second portion of said layer of silicon dioxide positioned above said second silicon/germanium region;
    performing an etching process to reduce a thickness of said exposed second portion of said layer of silicon dioxide to thereby define a reduced thickness layer of silicon dioxide having a post-etch thickness that is less than said original thickness;
    removing said masking layer;
    forming a first gate structure of a first transistor device above said layer of silicon dioxide having said original thickness; and
    forming a second gate structure of a second transistor device above said reduced thickness layer of silicon dioxide having said post-etch thickness.

18. The method of claim 17, wherein a root mean square (RMS) of a surface roughness of said layer of silicon dioxide as deposited is less than or equal to 0.1 nm.

19. The method of claim 17, wherein said original thickness falls within the range of 3-5 nm and said post-etch thickness is about 1 nm.

20. The method of claim 16, wherein said ALD process is performed using an organometallic precursor.

* * * * *

UNITED STATES PATENT AND TRADEMARK OFFICE
CERTIFICATE OF CORRECTION

| | | |
|---|---|---|
| PATENT NO. | : 10,109,492 B2 | Page 1 of 1 |
| APPLICATION NO. | : 13/775416 | |
| DATED | : October 23, 2018 | |
| INVENTOR(S) | : Gabriela Dilliway et al. | |

It is certified that error appears in the above-identified patent and that said Letters Patent is hereby corrected as shown below:

In the Claims

Column 10, Line 62 (Claim 20, Line 1), change "claim 16" to -- claim 17 --.

Signed and Sealed this
Second Day of April, 2019

Andrei Iancu
*Director of the United States Patent and Trademark Office*